United States Patent [19]

Sato et al.

[11] Patent Number: 4,479,200
[45] Date of Patent: Oct. 23, 1984

[54] SEMICONDUCTOR MEMORY DEVICE

[75] Inventors: Masashi Sato, Kawasaki; Yasuhisa Sugo, Tokyo, both of Japan

[73] Assignee: Fujitsu Limited, Kawasaki, Japan

[21] Appl. No.: 453,110

[22] Filed: Dec. 27, 1982

[30] Foreign Application Priority Data

Dec. 29, 1981 [JP] Japan ................ 56-213411

[51] Int. Cl.$^3$ ............................................. G11C 7/00
[52] U.S. Cl. ......................... 365/175; 365/179; 365/189
[58] Field of Search .............. 365/175, 179, 189, 190

[56] References Cited
U.S. PATENT DOCUMENTS 4,057,789 11/1977 Spadavecchia et al. .

OTHER PUBLICATIONS

IBM Technical Disclosure Bulletin—vol. 21 No. 4, Sep. 1978; pp. 1476–1478.
IEEE Journal of Solid-State Circuits, "A 25-ns Read Access Bipolar 1 Kbit TTL RAM", by Mayumi et al., vol. SC-9, No. 5, Oct. 1974, pp. 283–284.

Primary Examiner—James W. Moffitt
Attorney, Agent, or Firm—Staas & Halsey

[57] ABSTRACT

A semiconductor memory device includes at least, a memory cell including a first Schottky diode therein, a word line, a bit line, a first constant-current circuit for the word line, a second constant-current circuit for the bit line, and a bias circuit for biasing the first and second constant-current circuits. The bias circuit contains therein a second Schottky barrier diode. A forward voltage $V_F$ of the second Schottky barrier diode is substantially the same as that of the first Schottky barrier diode.

4 Claims, 4 Drawing Figures

SEMICONDUCTOR MEMORY DEVICE

BACKGROUND OF THE INVENTION

1. Field of the Invention

The present invention relates to a semiconductor memory device, more particularly to a semiconductor memory device comprised of static type memory cells each including, as a load, two parallel circuits comprised of a Schottky barrier diode (SBD) and resistor.

2. Description of the Prior Art

A static type memory cell usually comprised of a pair transistors formed as a flip-flop and of loads connected to the transistors. The memory cell is driven by a word line and a bit line. The word line is driven by a word decoder driver and the bit line is driven by a bit current supplying circuit (explained in detail hereinafter).

The loads to be connected to the transistors usually comprise a resistor. In recent years, however, loads have often been constructed in a form of SBD's and resistors in parallel circuits. Such loads have the advantage of enabling a high degree of speed in the read/write operation in the memory. The reason for this is well known.

In the prior art, however, static type memory cells containing SBD's, suffer from problems arising from the variation in forward voltage $V_F$ of the SBD's due to the manufacturing process, i.e., arising from the inability to maintain $V_F$ strictly at a predetermined value. The first problem is that a large write margin is required to prevent an erroneous write operation. The second is that an insufficient write current must be compensated.

SUMMARY OF THE INVENTION

It is an object of the present invention to provide a semiconductor memory device in which a bias circuit works not only to achieve its inherent biasing operation, but also to easily suppress the variation of $V_F$ to substantially zero, thereby eliminating the above two problems of the prior art.

The above object is attained by a bias circuit incorporating an SBD identical to the SBD's comprising the memory cell, due to the experimentally proven fact that all SBD's produced from the same production lot have substantially the same value of $V_F$. Consequently, when the $V_F$ of the SBD is large, it will increase the current flowing through a first constant current circuit (mentioned later), thereby decreasing the "low level" of the word line, and, simultaneously, increasing the current flowing through a second constant current circuit, (mentioned later).

BRIEF DESCRIPTION OF THE DRAWINGS

The present invention will be more apparent from the ensuing description with reference to the accompanying drawings, wherein.

DESCRIPTION OF THE PREFERRED EMBODIMENTS

Figure 1:
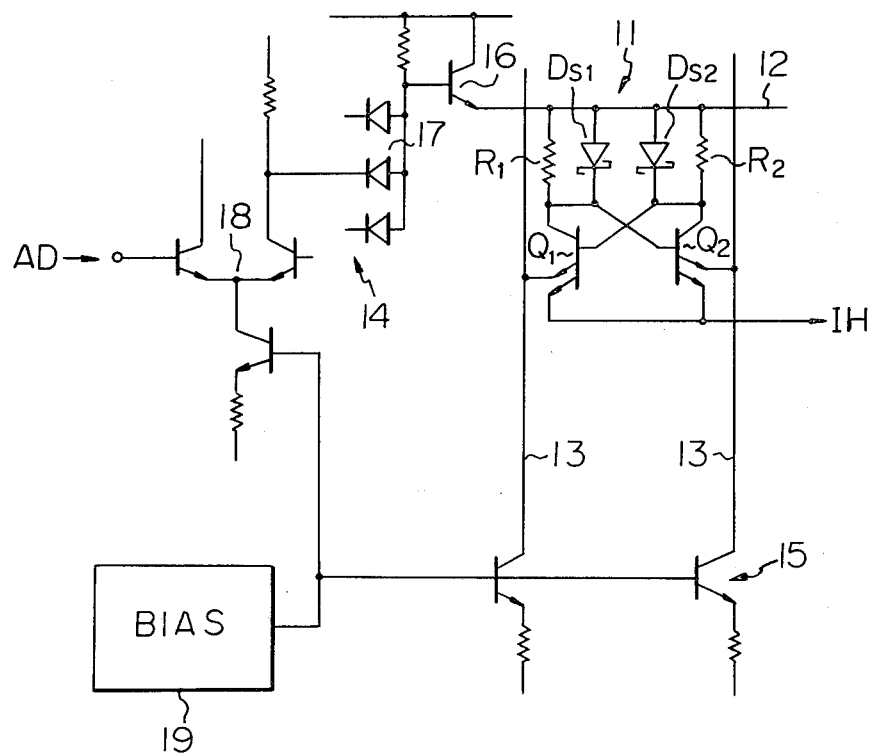
FIG. 1 is a circuit diagram of a prior art semiconductor memory device.

FIG. 1 is a circuit diagram of a prior art semiconductor memory device. In FIG. 1, reference numeral 11 represents a static type memory cell. In actuality, many identical memory cells (not shown) are arranged in both the X and Y directions. The memory cell 11 is connected to both word line 12 and bit lines, i.e. bit line pair, 13. In actuality, many identical word and bit lines (not shown) are distributed on a substrate.

The word line 12 is connected to a word decoder driver 14 provided with a first constant-current circuit 18. Reference numeral 16 represents a word driver. Reference numeral 17 represents a group of diodes which cooperate with the first constant-current circuit 18 so as to construct a word decoder of the diode-matrix type. Reference symbol AD denotes an address.

The bit lines 13 are connected to a second constant-current circuit 15 so as to produce bit current flowing through the bit lines. The second constant-current circuit 15 is connected to a bias circuit 19 together with the first constant-current circuit 18. (Alternatively, the circuit 15 may be connected independently from the circuit 18). This bias circuit 19 functions to maintain the constant currents flowing through the circuits 15 and 18 at predetermined values.

The present invention, as previously mentioned, particularly refers to a static type memory cell including an SBD therein. In the prior art circuit of FIG. 1, the loads, to be connected to transistors $Q_1$ and $Q_2$ comprising the memory cell 11 in a form of a flip-flop, are constructed as a first parallel circuit of an SBD $D_{s1}$ and a resistor $R_1$ and a second parallel circuit of an SBD $D_{s2}$ and a resistor $R_2$, respectively. In this circuit, a hold current IH is absorbed from the memory cell via the transistors $Q_1$ and $Q_2$. The merit of utilizing the SBD's resides in, as previously mentioned, achieving a high speed read/write operation of the memory.

The SBD, however, is not advantageous from the viewpoint of the forward voltage $V_F$. That is, as previously mentioned, the voltage $V_F$ is not constant but varies due to the manufacturing process. The variation of the $V_F$ defined by the SBD's $D_{s1}$ and $D_{s2}$ causes variation in the "low" level of the nonselected word line. If the memory cell 11 is connected to the currently nonselected word line the variation of the $V_F$ will swing the "low" level of the word line 12, determined by the emitter voltage of the word driver 16, upward or downward. Such variation of the word line voltage will often produce erroneous write operations. Therefore, a large write margin must usually be taken into consideration during the write operation to substantially absorb such variation.

Further, a large $V_F$, may sometimes cause a write current to be divided into the transistor $Q_1$ or $Q_2$ which is off during the write operation. The input of the divided write current into an off transistor will lead to insufficient write current for achieving the optimal write operation. Therefore, it is necessary to compensate for the insufficiency of the write current due to division of the write current.

Figure 2:
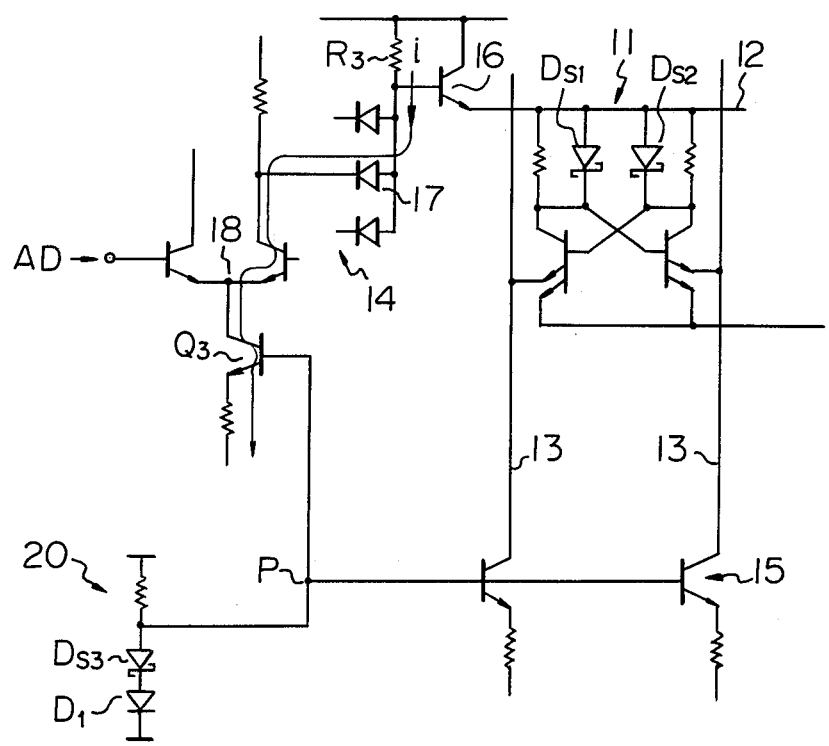
FIG. 2 is a circuit diagram of a semiconductor memory device according to a first embodiment of the present invention.

FIG. 2 is a circuit diagram of a semiconductor memory device according to a first embodiment of the present invention. In FIG. 2, members the same as those of FIG. 1 are represented by the same reference numerals or symbols. (Same for later figures). In FIG. 2, reference numeral 20 represents a bias circuit having an SBD $D_{s3}$. The $V_F$ characteristic of the SBD $D_{s3}$ is substantially the same as the $V_F$ characteristics of the SBD's $D_{s1}$ and $D_{s2}$, because these SBD's are all in the same semiconductor chip.

Assuming that SBD's $D_{s1}$ and $D_{s2}$ are manufactured with large $V_F$'s SBD$_{s3}$ will also have a large $V_F$. Accordingly, the voltage level at the point P in FIG. 2 will also be increased by the SBD $D_{s3}$ along with the increase of the $V_F$ thereof. The relatively high voltage level at the point P is, on one hand, transmitted to the first constant-current circuit 18 by way of a transistor $Q_3$. Thus, the transistor $Q_3$ is made highly conductive and, thereby, the constant current flowing through the circuit 18 is changed to a relatively high level. This means an excessive current i flows along the arrow shown in FIG. 2. At the same time, the voltage drop across a resistor $R_3$ increases due to the current i flowing therethrough, reducing the voltage level of the word line 12. As a result, the large $V_F$ of the SBD's $D_{s1}$ and $D_{s2}$ can be substantially suppressed.

On the other hand, the relatively high voltage level at the point P influences the second constant-current circuit 15, changing the constant-current flowing therethrough to a relatively high level. This high constant-current can compensate for the aforementioned insufficiency of the write current. Consequently, the variation of the $V_F$ in each semiconductor memory device can be substantially compensated for by each lot. Further, in FIG. 2, a diode $D_1$ in the bias circuit 20 functions to balance with the base-emitter voltage of each transistor comprising the second constant current circuit 15. Accordingly, the diode $D_1$ is not that essential a member in the present invention.

Figure 3:
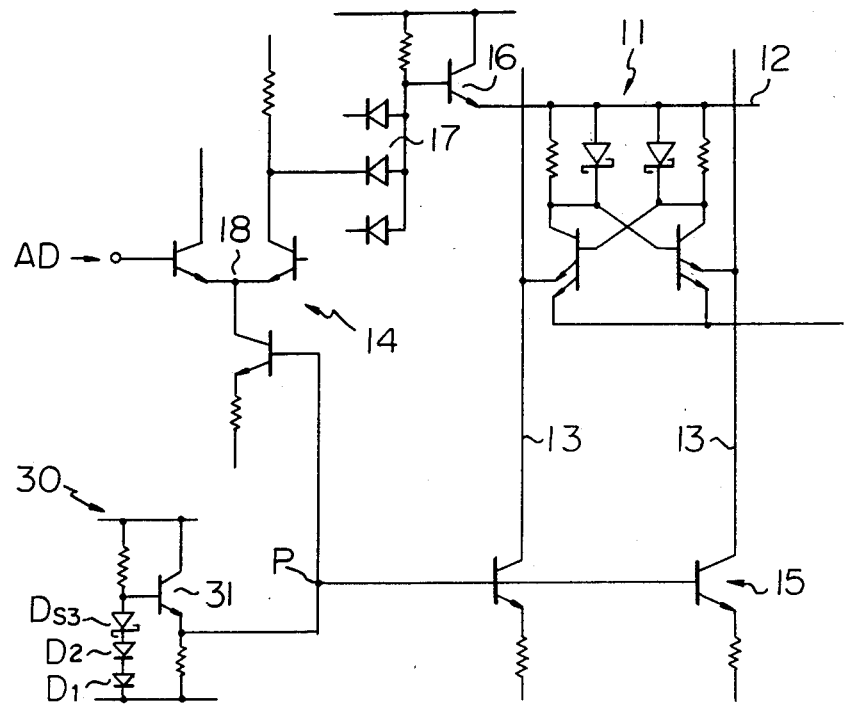
FIG. 3 is a circuit diagram of a semiconductor memory device according to a second embodiment of the present invention.

FIG. 3 is a circuit diagram of a semiconductor memory device according to a second embodiment of the present invention. The principle of a bias circuit 30 in the second embodiment is similar to that of the bias circuit 20 in the first embodiment. The second embodiment, however, is more advantageous than the first from the following viewpoint. In the first embodiment, if a load at the point P, viewed from the SBD $D_{s3}$, becomes relatively large, a relatively large current flows through the bias circuit 20. Therefore, it is difficult to correctly vary the voltage level at the point P with a variation of just the forward voltage $V_F$ defined by $D_{s3}$.

However, in the second embodiment, an emitter follower 31 is employed in the bias circuit 30. The emitter follower 31 cooperates with the SBD $D_{s3}$, and thus, stable control of the voltage level at the point P can be performed regardless of the load at point P viewed from the SBD $D_{s3}$. In FIG. 3, the function of the diode $D_1$ and also a diode $D_2$ is the same as that of the diode $D_1$ used in the first embodiment. To be specific, the newly employed diode $D_2$ of FIG. 3 functions to balance the base-emitter voltage of the transistor comprising the emitter follower 31.

Figure 4:
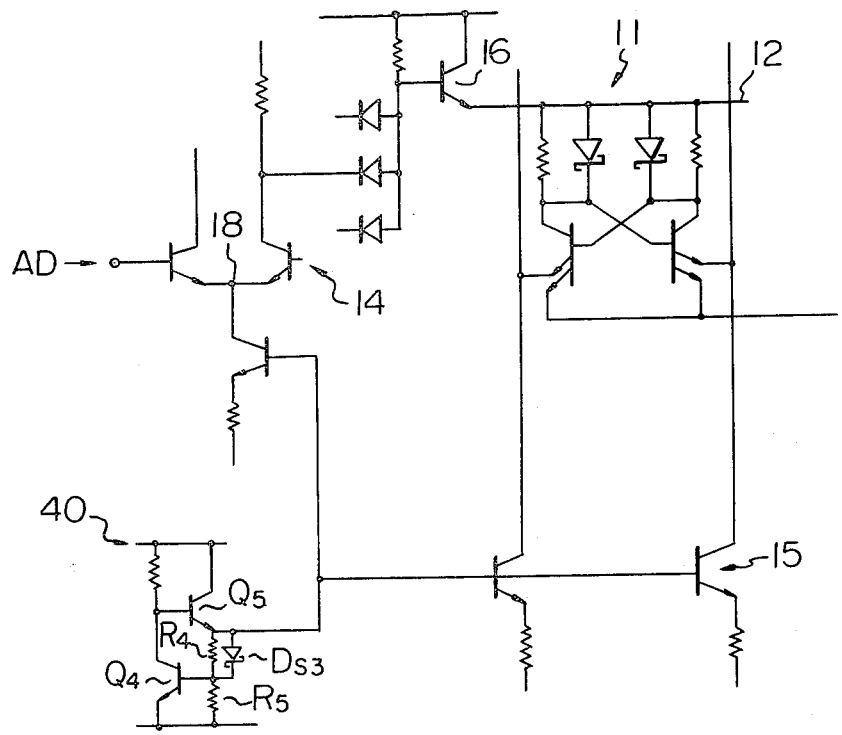
FIG. 4 is a circuit diagram of a semiconductor memory device according to a third embodiment of the present invention.

FIG. 4 is a circuit diagram of a semiconductor memory device according to a third embodiment of the present invention. In a bias circuit 40 of the third embodiment, the SBD $D_{s3}$ is incorporated in the manner shown in FIG. 4. This arrangement has the following two advantages. First, an optimum load characteristic can be obtained because a feedback path is created from a transistor $Q_4$ to a transistor $Q_5$. Second, the value of the $V_F$ of the SBD $D_{s3}$ can be shifted, in advance, to a desired value by suitably selecting the ratio between the values of resistors $R_4$ and $R_5$.

As mentioned above in detail, the semiconductor memory device can not only achieve a high speed read/write operation, but can also finely cope with variation of the $V_F$ defined by the SBD.

We claim:

1. A semiconductor memory device comprising:
 a plurality of word lines;
 a plurality of bit lines intersecting said plurality of word lines;
 static type memory cells, respectively, operatively connected at the intersections of said plurality of word lines and bit lines, having parallel circuits as loads, each of said loads comprising:
  a first Schottky diode having a forward voltage; and
  a resistor operatively connected in parallel with said first Schottky barrier diode;
 word decoder driver circuits, respectively, operatively connected to said word lines, each including a first constant-current circuit;
 a second constant-current circuit, operatively connected to said plurality of bit lines, for producing bit currents flowing through said bit lines; and
 a bias circuit, operatively connected to said first constant-current circuit and said second constant-current circuit, for biasing, commonly or independently, said second constant-current circuit and said first constant-current circuit, said bias circuit comprising a second Schottky barrier diode for compensating a variation in the forward voltage defined by said first Schottky barrier diode, said second Schottky barrier diode having substantially the same forward voltage as that of said first Schottky barrier diode.

2. A semiconductor memory device as set forth in claim 1, wherein:
 said bias circuit further comprises a first resistor, operatively connected to said first and second constant current circuits, and wherein said second Schottky barrier diode is operatively connected in series with said first resistor forming a node therebetween, and a first diode operatively connected in series with said second Schottky barrier diode;
 the voltage level at said node being applied to said second constant-current circuit and said first constant-current circuit so as to vary the constant currents flowing therethrough; and
 said second constant-current source comprises transistors each having a base emitter voltage, said first diode balancing the base-emitter voltage of said transistors.

3. A semiconductor memory device as set forth in claim 2, wherein said bias circuit further comprises:
 an emitter follower transistor having a base and a base-emitter voltage and wherein said base is operatively connected to said node between said first resistor and said second Schottky barrier diode; and
 a second diode, operatively connected in series with said first diode, for balancing the base-emitter voltage of said emitter follower transistor.

4. A semiconductor memory device as set forth in claim 1, wherein said bias circuit further comprises:
 a first transistor having an emitter having a voltage and a base;
 a second transistor having a base and collector, operatively connected to said first transistor; and two resistors operatively connected in series, a first one of said two resistors operatively connected in parallel with said second Schottky barrier diode, the parallel connection forming a feedback path through the emitter of said first transistor and the base of said second transistor, the collector of said second transistor being operatively connected to the base of said first transistor, the second one of said two resistors being operatively connected between the base and the emitter of said first transistor, and the voltage level at the emitter of said first transistor being applied to said second constant-current circuit and said first constant-current circuit so as to vary the constant currents flowing therethrough.

* * * * *